(12) United States Patent
Chan et al.

(10) Patent No.: US 8,785,313 B2
(45) Date of Patent: Jul. 22, 2014

(54) METHOD OF MANUFACTURING DEVICE HAVING A BLOCKING STRUCTURE

(71) Applicant: Taiwan Semiconductor Manufacturing Company, Ltd., Hsinchu (TW)

(72) Inventors: Bor-Wen Chan, Hsinchu (TW); Hsueh Wen Tsau, Zhunan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/033,904

(22) Filed: Sep. 23, 2013

(65) Prior Publication Data

US 2014/0024207 A1      Jan. 23, 2014

Related U.S. Application Data

(62) Division of application No. 12/753,372, filed on Apr. 2, 2010, now Pat. No. 8,564,072.

(51) Int. Cl.
*H01L 21/3205* (2006.01)
*H01L 21/4763* (2006.01)

(52) U.S. Cl.
USPC ..... 438/592; 438/183; 257/407; 257/E29.126

(58) Field of Classification Search
USPC .................. 438/183, 592; 257/407, E29.126
See application file for complete search history.

(56) References Cited

U.S. PATENT DOCUMENTS

| 6,645,818 | B1 | 11/2003 | Sing et al. | |
|---|---|---|---|---|
| 6,921,711 | B2 | 7/2005 | Cabral, Jr. et al. | |
| 2005/0051854 | A1* | 3/2005 | Cabral et al. | 257/407 |
| 2006/0065939 | A1* | 3/2006 | Doczy et al. | 257/412 |
| 2010/0176456 | A1* | 7/2010 | Ikeno et al. | 257/369 |

* cited by examiner

*Primary Examiner* — Ha Tran T Nguyen
*Assistant Examiner* — Aaron Dehne
(74) *Attorney, Agent, or Firm* — Lowe Hauptman & Ham, LLP (57) ABSTRACT

A method of manufacturing a semiconductor device, and the method includes forming a stack of a work function layer, a blocking structure, and a metal cap layer sequentially on a substrate. The forming of the blocking structure includes sequentially depositing at least a metal diffusion prevention layer over the work function layer and an electrical performance enhancement layer over the metal diffusion prevention layer before forming the metal cap layer. The electrical performance enhancement layer includes a TiN layer having a Ti/N ratio greater than 1.

19 Claims, 9 Drawing Sheets

METHOD OF MANUFACTURING DEVICE HAVING A BLOCKING STRUCTURE

PRIORITY CLAIM

The present application is a divisional of U.S. application Ser. No. 12/753,272, filed Apr. 2, 2010, the disclosure of which is incorporated herein by reference in its entirety.

TECHNICAL FIELD

The present disclosure relates to a semiconductor device having a blocking structure and a method of manufacturing the same.

BACKGROUND

The recent trend in miniaturizing integrated circuits has exposed several drawbacks of the traditional gate stack configuration of a silicon dioxide gate dielectric in combination with a poly-silicon gate electrode. To address the issues, a new gate stack configuration of a metal gate electrode and a high-k gate dielectric has been introduced. There is, however, still a need for further improvements in such a new gate stack configuration.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Throughout the description presented below, it will be understood that when a layer is referred to as being 'on' or 'over' another layer or substrate, it can be in direct contact with the other layer or substrate, or intervening layers may also be present therebetween.

Figure 1:
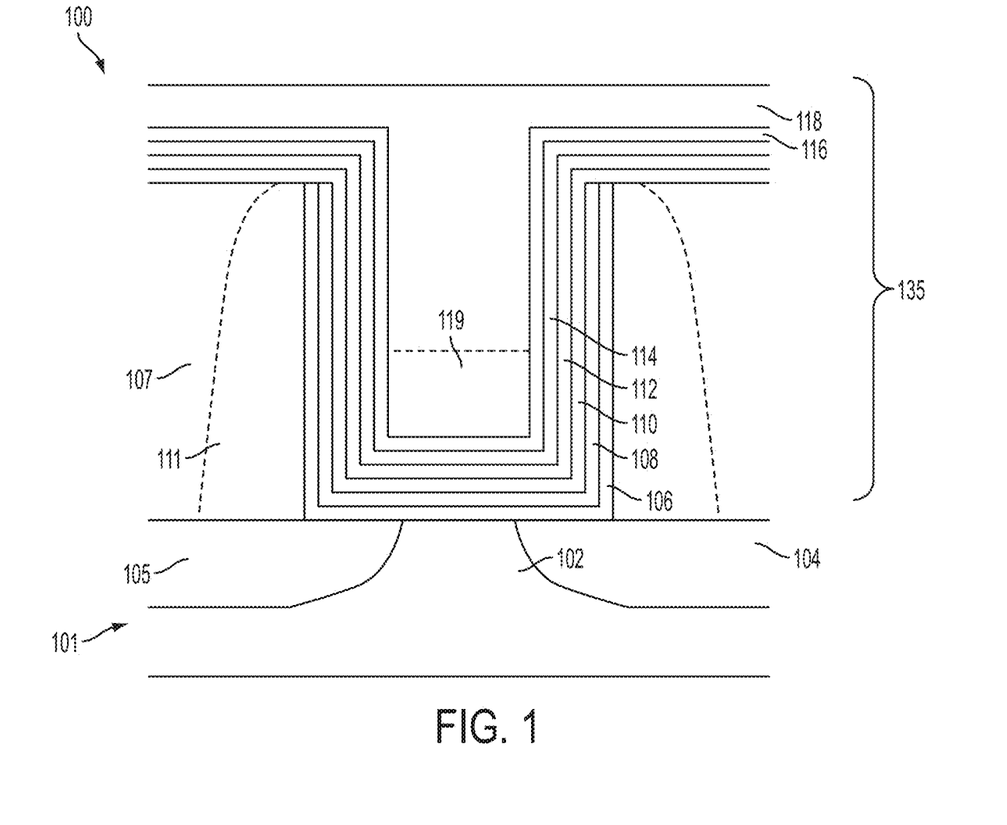
FIG. 1 is a schematic, cross-sectional view of a semiconductor device to which one or more embodiments is applicable.

FIG. 1 is a schematic, cross-sectional view of a semiconductor device 100 to which one or more embodiments is applicable. The semiconductor device 100 is a MOS (metal oxide semiconductor) device which is widely used in microprocessors, microcontrollers, memories, and other digital circuits. In at least some embodiments, the MOS device can be a p-type metal-oxide-semiconductor field effect transistor (PMOSFET) or an n-type metal-oxide-semiconductor field effect transistor (NMOSFTE).

The semiconductor device 100 includes a substrate 101 having therein doped regions 104, 105 and a channel region 102. The doped regions 104 and 105 define source/drain regions. If the MOS device is an NMOS device, the source/drain regions can be n-type regions and the channel region can be a p-type region. If the MOS device is a PMOS device, the source/drain regions can be p-type regions and the channel region can be an n-type region.

A gate stack 135 is formed on the substrate 101, corresponding to the channel region 102. The gate stack 135 includes a gate dielectric 108, a work function layer 112, a blocking structure 114 and a cap layer 118.

The substrate 101 is, for instance, a silicon substrate. The substrate 101 may alternatively comprise silicon germanium (SiGe), allium arsenic, or other suitable semiconductor materials. Further, in some embodiments, shallow trench isolation (STI) regions (not shown) are formed in the substrate 101 for isolating the source/drain regions 104, 105 in the substrate 101. The isolation structure, i.e., STI regions, is formed of silicon oxide, silicon nitride, silicon oxynitride, fluoride-doped silicate, and/or any other low k dielectric materials. The substrate 101 may further include other features, such as various doped regions, a buried layer, and/or an epitaxy (epi) layer. In some embodiments, the substrate 101 is a semiconductor on insulator, such as silicon on insulator (SOI). In other examples, the substrate 101 may include a doped epi layer, a gradient semiconductor layer, and/or may further include a semiconductor layer overlying another semiconductor layer of a different type such as a silicon layer on a silicon germanium layer. Other arrangements are within the scope of this disclosure.

In some embodiments, the semiconductor device 100 further includes, on opposite sides of the gate stack 135, spacer(s) 111. The spacer 111 is a dielectric layer with no or a predetermined amount of impurity therein. In one or more embodiments, the spacer 111 is formed of silicon nitride. In further embodiments, the spacer 111 is silicon carbide. In another embodiment, the spacer 111 contains impurity, such as boron, carbon, fluorine, or combinations thereof. In some embodiments, the shape of the spacer 111 differs from the shape shown in FIG. 1. In some embodiments, an L-shaped spacer (not shown) is formed, e.g., by etching a previously formed spacer. The spacer 111 is formed by any of a number of suitable methods, e.g., plasma enhanced chemical vapor deposition (PECVD), low-pressure chemical vapor deposition (LPCVD), sub-atmospheric chemical vapor deposition (SACVD), atomic layer deposition (ALD), and the like. The spacer 111 is formed in one or more embodiments to have any suitable thickness, e.g., in the range of from about 50 Å to about 400 Å. Other arrangements, such as multilayer spacers or spacer-free configurations, are within the scope of this disclosure.

In some embodiments, the semiconductor device 100 further includes a dielectric layer 107 around the spacer 111 and the gate stack 135. The dielectric layer 107 comprises silicon dioxide or a low-k material. In one or more embodiments, the dielectric layer 107 is doped with suitable elements. In further embodiments, the dielectric layer 107 is an interlayer dielectric (ILD) layer formed of silicon oxide, silicon nitride, silicon oxynitride, spin-on glass (SOG), fluorinated silica glass (FSG), carbon doped silicon oxide (e.g., SiCOH), polyimide, other suitable dielectric materials, and/or combinations thereof. Exemplary processes for forming the dielectric layer 107 include deposition, such as a high density plasma deposition, followed by a planarization using, e.g., chemical mechanical polishing (CMP). Other arrangements are within the scope of this disclosure.

The gate dielectric 108 may include silicon dioxide. The gate dielectric 108 in some embodiments is formed of high-k dielectric materials, e.g., materials that have a dielectric constant higher than that of silicon dioxide. Such high-k gate dielectric can reduce gate leakage currents to an acceptable level. High-k dielectric materials include, for instance, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. The thickness of the high-k gate dielectric 108 is in the range of, for instance, from about 5 Å to about 40 Å, depending on process tolerances, measurement capabilities, and other variables. Other arrangements are within the scope of this disclosure.

In some embodiments, an interfacial layer 106 is interposed as a buffer between the gate dielectric 108 and the substrate 101 to reduce damages or electrical issues between the gate dielectric 108 and the substrate 101. Examples of the interfacial layer 106 include silicon oxide having a thickness ranging from about 5 to about 10 Å. The gate dielectric 108, in some embodiments, is formed on the interfacial layer 106 by atomic layer deposition (ALD), chemical vapor deposition (CVD) or other suitable techniques.

To ensure that the metal gate electrode has appropriate work functions for NMOS, an n-type metal having a work function in the range of from about 3.9 to about 4.2 eV is used as the work function layer 112. Such n-type metal includes Ti, Zr, Hf, Al, Ta and alloys thereof. Metal carbides of Ti, Zr, Hf, Al, and Ta are also suitable n-type metals. In some embodiments, the n-type metal work function layer 112 is formed by physical vapor deposition (PVD), CVD or other suitable techniques to a thickness of about 100 Å. Other arrangements are within the scope of this disclosure.

To ensure that the metal gate electrode has appropriate work functions for PMOS, a p-type metal having a work function in the range of from about 4.9 to about 5.2 eV is used as the work function layer 112. Such p-type metal includes Pt, Ru, Pd and alloys thereof. Metal nitrides including Ti, Ta, Ru, W and TiAl nitrides are also suitable p-type metals. In some embodiments, the p-type metal work function layer 112 is formed by PVD, CVD or other suitable techniques to a thickness of about 100 Å. Other arrangements are within the scope of this disclosure.

In some embodiments, a barrier layer 110 is interposed between the work function layer 112 and the gate dielectric 108 to improve adhesion of the work function layer 112 to the gate dielectric 108. The barrier layer 110 further prevents diffusion of the metal or metals of the work function layer 112 into the gate dielectric 108. In one or more embodiments, the barrier layer 110 is sufficiently thin, i.e., about 30 Å or less, to allow the work function layer 112 to properly adjust the work function levels of the CMOS device. Materials for the barrier layer 110 include, but are not limited to, metal nitrides of Zr, Hf, Ti, and Ta. Other arrangements are within the scope of this disclosure.

The cap layer 118 is of a conductive material that defines the remainder of the gate stack 135 and is provided for supplying signals to the work function layer 112. The configuration of the cap layer 118 in one or more embodiments is selected so as to be resistant to subsequent processing steps for finishing the semiconductor device 100. In some embodiments, cap layer 118 has a thickness from about 200 Å to about 1000 Å. Materials for the cap layer 118 include metals such as Al, Cu and W. Al is the widely used material. The cap layer 118 is formed by one or more of electroplating, CVD, ALD, PVD etc. In some embodiments, a thin layer 119 of Al or another metal is formed first, e.g., by CVD and/or electroplating, followed by the formation of a much greater thickness of the cap layer 118, e.g., by PVD. Other arrangements are within the scope of this disclosure.

In some embodiments, a wetting layer 116 is formed immediately below the cap layer 118 to enhance adhesion of the cap layer 118 to the underlying layer. Ti is an example for such wetting layer 116.

When the cap layer 118 is a made of a metal, such as Al, metal diffusion from the cap layer 118 to the underlying layers has been found to result in undesirably higher threshold voltages in PMOS and higher gate leakage currents in NMOS.

The blocking structure 114 can be a single-layer structure or a multi-layer structure. In some embodiments using a single-layer structure, the blocking structure 114 can include a first portion for preventing diffusion of the metal of the cap layer 118 into the underlying layers and a second portion for providing a proper stress to the channel region to cause the strain effect that, in turn, enhances the electrical performance of the semiconductor device 100. In other embodiments using a multi-layer structure, the blocking structure 114 can include a first layer for preventing diffusion of the metal of the cap layer 118 into the underlying layers and a second layer for providing a proper stress to the channel region to cause the strain effect that, in turn, enhances the electrical performance of the semiconductor device 100.

In some embodiments, the portion or layer of the blocking structure 114 for preventing diffusion can be made of at least one material, such as TiN, TaN, TiON, TaON, one or more suitable metal diffusion barrier materials, or any combinations thereof.

As noted, another portion or layer of the blocking structure 114 is to provide a proper stress to the channel region to cause the strain effect that, in turn, enhances the electrical performance of the semiconductor device 100. "Electrical performance" is used herein to indicate carrier (i.e., hole or electron) mobility in the channel region 102. "Electrical performance enhancement effect" is used herein to indicate increased carrier mobility in the channel region 102. In an NMOS device, for example, increased electron mobility in the channel region 102 results in a higher switching speed and/or a higher drive current. In a PMOS device, increased hole mobility in the channel region 102 results in similar effects, i.e., a higher switching speed and/or a higher drive current. As materials for the portion or layer of the blocking structure 114 for providing a stress, TiN has been found to cause compressive stress, whereas TaN has been found to cause tensile or neutral stress. Other materials, including but not limited to, TiON and TaON, may be used in various embodiments for providing appropriate stress and/or preventing metal diffusion from the cap layer.

Since PMOS and NMOS devices include different types of carriers, they respond differently to different types of strain, i.e., compressive strain and tensile strain. For example, a compressive stress is desirable for NMOS device, whereas a tensile stress is considered suitable for PMOS device. The material, thickness or other configuration considerations of layers, such as the blocking structure 114, are selectable to create a desirable stress on the channel region 102 below. In some embodiments, the blocking structure 114 generally obtains greater electrical performance enhancement effects in NMOS device than in PMOS device. The reason is that, assuming all other layers (e.g., gate dielectric 108, barrier layer 110) are identical, the work function layer 112 in PMOS device is usually thicker than in NMOS device. The thicker work function layer 112 in PMOS device results in a farther distance from the blocking structure 114 to the channel region 102, which in turn, reduces any stress the blocking structure 114 might cause on the channel region 102.

Figure 2A:
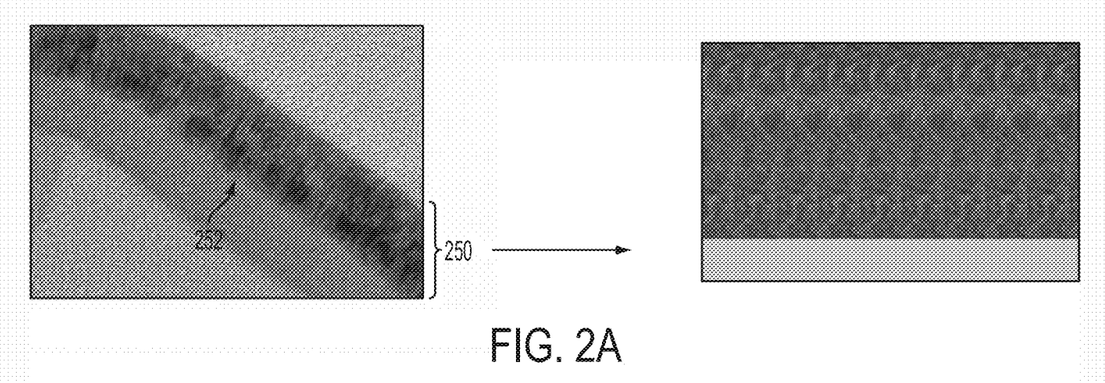
FIGS. 2A-2B are microphotographs of TiN layers of a blocking structure in accordance with one or more embodiments.
Figure 2B:
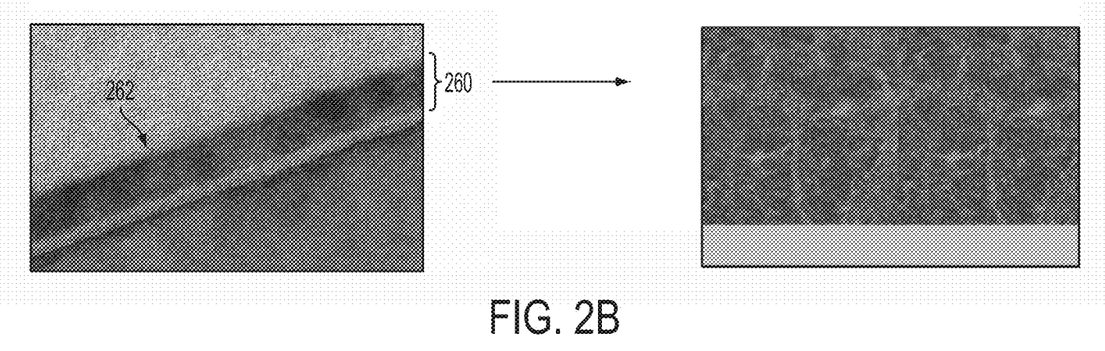

FIGS. 2A-2B are microphotographs of TiN layers of a blocking structure in accordance with one or more embodiments. Specifically, FIG. 2A is a microphotograph of a metallic TiN (hereinafter mTiN) layer 250, and FIG. 2B is a microphotograph of a poisoned TiN (hereinafter pTiN) layer 260.

The two types of TiN are primarily different in the Ti/N ratio. In particular, pTiN has a Ti/N ratio lower than 1. In some embodiments, the Ti/N ratio of pTiN is in a range from 0.7 to below 1. In contrast, mTiN has a Ti/N ratio greater than or equal to 1. In some embodiments, the Ti/N ratio of mTiN is in a range from 1 to 1.5.

The two types of TiN also differ in other characteristics. For example, as can be seen in FIGS. 2A and 2B, the pTiN layer 260 has a less grain boundary 262 than a boundary 252 of the mTiN layer 250. Further, the structure of the pTiN layer 260 is bamboo-like, unlike the columnar structure of the mTiN layer 250. The above distinctions are believed to render the pTiN layer 260 a better metal diffusion barrier than the mTiN layer 250. In other words, the pTiN layer 260 exhibits a greater metal diffusion prevention effect than the mTiN layer 250.

Figure 3:
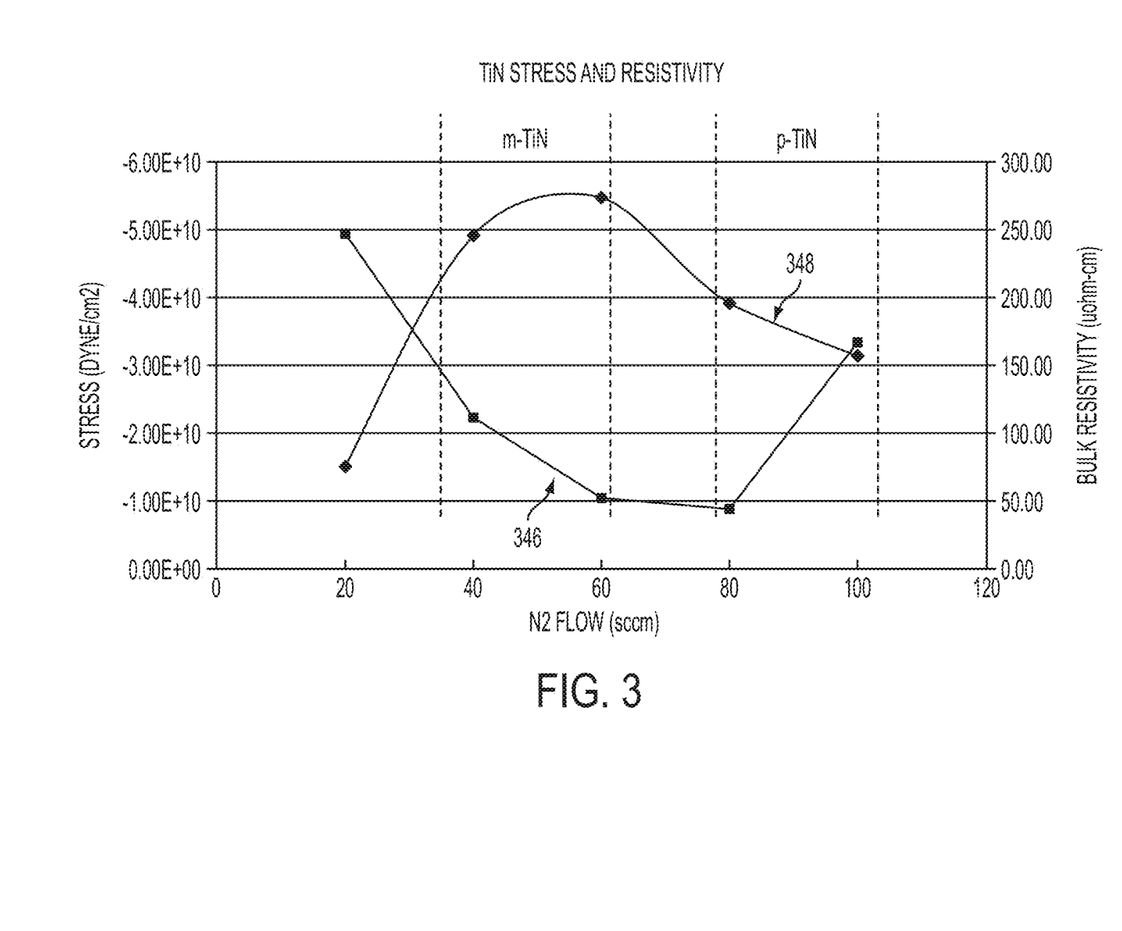
FIG. 3 is a graph comparing stress and resistivity of the TiN layers exemplarily illustrated in FIGS. 2A-2B.

FIG. 3 is a graph comparing other characteristics, i.e., stress and bulk resistivity, of mTiN and pTiN. Stress generated by TiN is shown by line 348, whereas bulk resistivity of TiN is shown by line 346. The regions where TiN is considered as mTiN and pTiN are annotated accordingly.

As can be seen in line 346, mTiN and pTiN have about the same range of bulk resistivity, meaning that the two types of TiN are equally good for conducting electrical signals from the cap layer 118 to the work function layer 112.

However, as can be seen in line 348 the stress generated by mTiN is much greater than pTiN. The particular examples being examined for producing the graphs of FIG. 3, the stress generated by mTiN is about −4.74 Gigapascals (GPa), compared to about −1.93 GPa generated by pTiN. The minus "−" sign indicates that the stress is compressive, meaning it would benefit NMOS more than PMOS.

Figure 4:
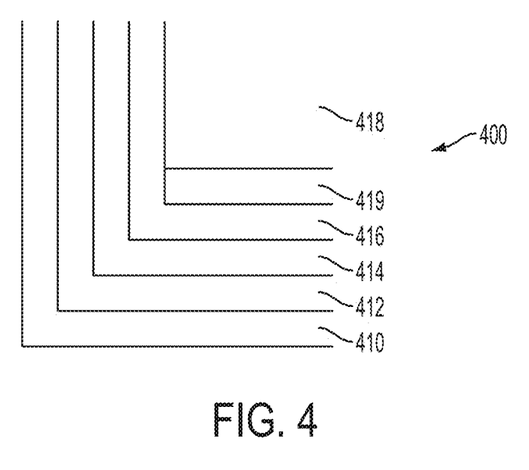
FIG. 4 is a partial, enlarged view of a multilayer stack used for determining effects of the TiN layers exemplarily illustrated in FIGS. 2A-2B, and FIGS. 5A-5B are graphs showing such effects.
Figure 5A:
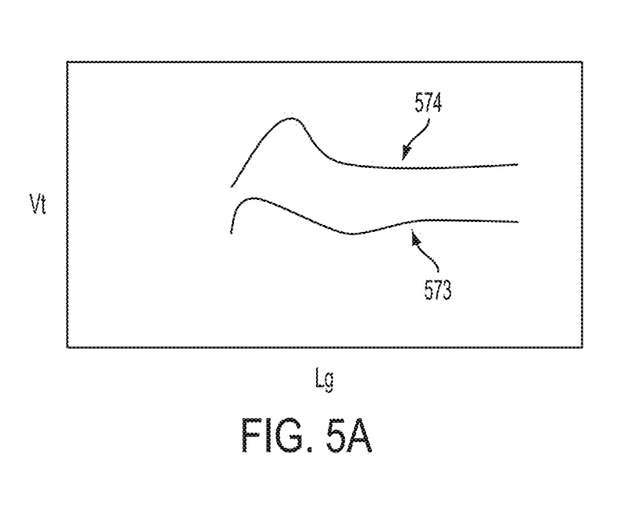
Figure 5B:
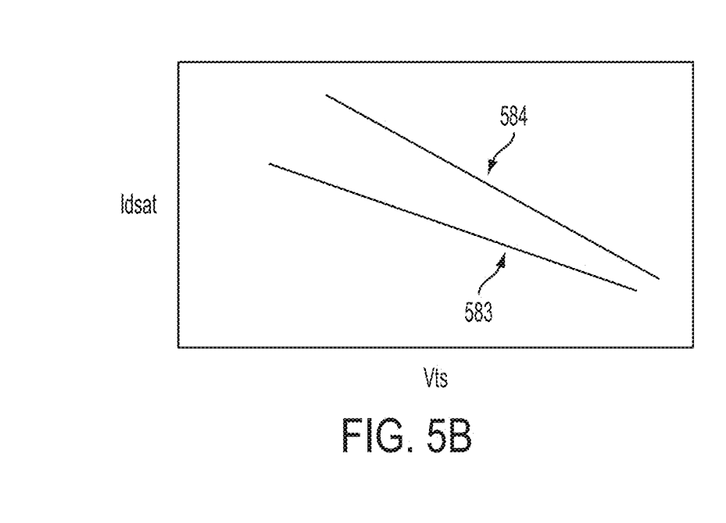

FIGS. 5A-5B are graphs comparing further effects achieved by mTiN and pTiN, and FIG. 4 is a partial, enlarged view of a multilayer stack 400 used for determining the effects shown in FIGS. 5A-5B. Specifically, FIG. 4 is similar to a simplified, enlarged view of the lower left corner of the gate stack 135 illustrated in FIG. 1. Similar to the gate stack 135, the stack 400 includes a barrier layer 410, a work function layer 412, a blocking structure 414, a wetting layer 416, a thin metal layer 419, and a cap layer 418. Two Examples based on the configuration of the stack 400. Except for the blocking structure 414, all other layers in the two Examples are identical, as detailed herein below:

The barrier layer 410;
The work function layer 412;
The wetting layer 416;
The metal layer 419; and
The cap layer 418.
Example 1 includes a 30 Å thick mTiN layer.
Example 2 includes a 20 Å thick pTiN layer.

The graph in FIG. 5A shows a comparison in threshold voltages between Example 1 (lines 573) and Example 2 (lines 574). As can be seen in FIG. 5A, the threshold voltages of Example 2 are higher (by about 30 mV) than those of Example 1, which indicates a lower level of Al diffusion in Example 2. It should also be noted that such lower level of Al diffusion is achieved by pTiN in Example 2 at a smaller thickness (20 Å) than mTiN (30 Å) in Example 1. That is, the metal diffusion prevention effect of pTiN is greater than that of mTiN. Thus, pTiN is suitable as a metal diffusion prevention layer.

The graph in FIG. 5B shows a comparison in drive current between Example 1 (lines 583) and Example 2 (lines 584). As can be seen in FIG. 5B, the drive current of Example 1 is higher than that of Example 2, which indicates a higher carrier mobility or higher electrical performance in Example 1. The increased carrier mobility is believed to be caused by higher compressive stress generated by mTiN in Example 1. That is, the electrical performance enhancement effect of mTiN is greater than that of pTiN. Thus, mTiN is suitable as an electrical performance enhancement layer.

By combining both pTiN and mTiN in a blocking structure, such as the blocking structure 114 illustrated in FIG. 1, both the metal diffusion prevention effect of pTiN and the electrical performance enhancement effect of mTiN can be realized in a single semiconductor device, such as the semiconductor device 100 or CMOS. In some embodiments, at least the metal diffusion prevention layer, i.e., the pTiN layer, is replaced, or used together, with one or more of the other materials suitable for the same purpose. Such materials, as discussed herein, include, but are not limited to, TaN, TiON, and TaON.

Figure 6:
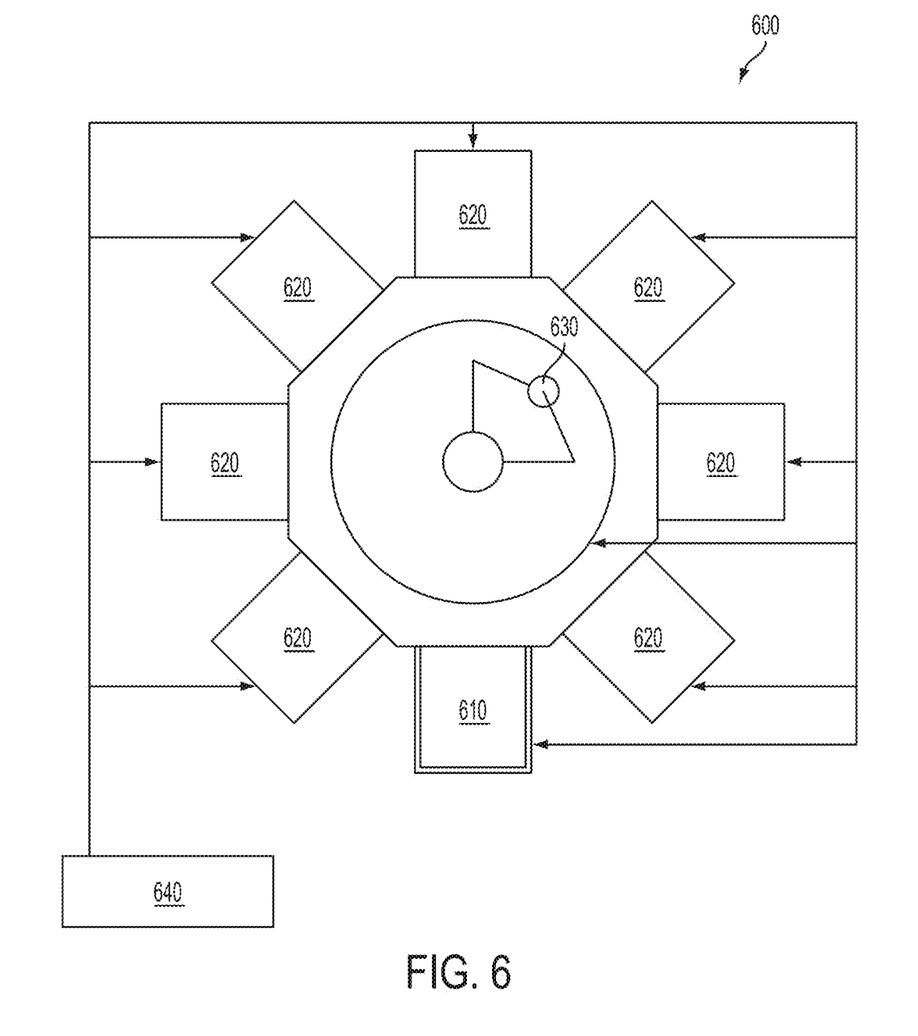
FIG. 6 is a schematic plan view of a processing system.
Figure 7:
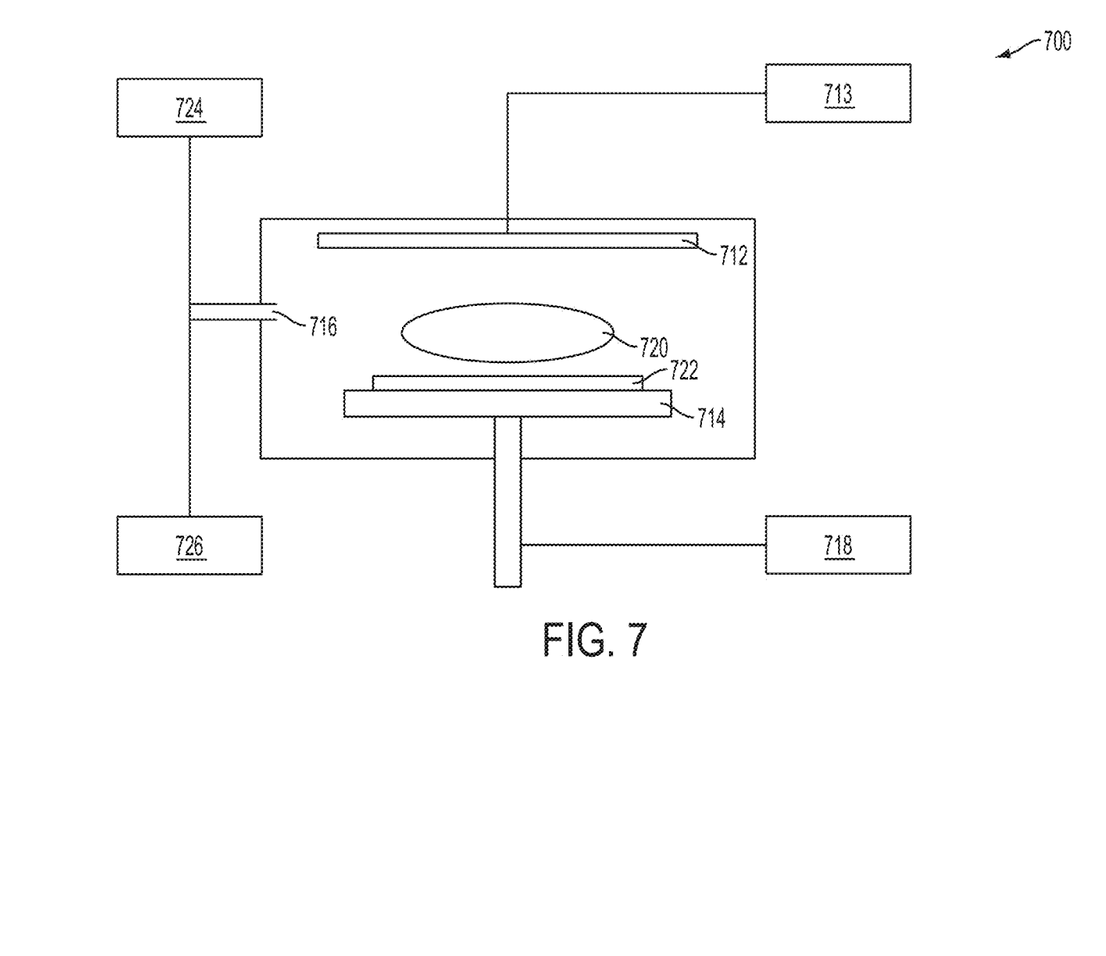
FIG. 7 is a schematic view of a process chamber in the system of FIG. 6 for forming the TiN layers exemplarily illustrated in FIGS. 2A-2B.

FIG. 6 is a schematic plan view of a processing system 600, and FIG. 7 is a schematic view of a process chamber 700 in the system of FIG. 6 for forming a blocking structure comprising both mTiN and pTiN in accordance with one or more embodiments.

The processing system 600 in FIG. 6 includes a load lock chamber 610, a plurality of process chambers 620, a robot 630, and a controller 640. The load lock chamber 610 transfers substrates, such as wafers, into and out of the processing system 600 under a vacuum environment. The robot 630 transfers the substrates among the load lock chamber 610 and the process chambers 620. The process chambers 620 are equipped to perform numerous processes such as CVD, ALD, PVD, annealing, etching, degassing, pre-cleaning, cleaning, post-cleaning, etc. The controller 640 is configured to control substrate transfer and processing. In one or more embodiments, the controller 640 comprises a hardware platform, such as a processor or controller chip coupled with a memory, which is programmable by software and/or firmware to perform the functions described herein. In some embodiments, the controller 340 comprises a dedicated hardware circuit, e.g., in form of an application-specific integrated circuit (ASIC), hardwired to perform one or more of the processes described herein.

While seven process chambers 620 are shown, any other number of process chambers 620 is within the scope of this disclosure. Likewise, in some embodiments, more than one robot 630 and/or load lock chamber 610 are provided in the processing system 600.

One of the process chambers 620 of the processing system 600 is illustrated in more detail in FIG. 7 as a PVD chamber 700. The chamber 700 includes a Ti target 712, a substrate support 714, and a gas inlet 716. The Ti target 712 is connected to a DC power source 713. The substrate support 714 is connected to an RF power source 718, and is for supporting thereon a substrate 722 on which TiN layers are to be formed. The gas inlet 716 is connected to gas supplies 724, 726. A controller (not shown) such as the controller 640 or a dedicated controller is provided to control the TiN deposition process by, for example, turning on/off or adjusting the power sources 713, 718, starting, stopping or adjusting gas flow from one or more of gas supplies 724, 726, and transferring or positioning the substrate 722 in/out of the chamber 700 and on the substrate support 714.

A TiN layer is formed on the substrate 722 by introducing a nitrogen gas from, e.g., the gas supply 724 into the chamber 700 while generating a plasma 720 in the chamber 700 by applying appropriate power levels from the DC power source 713 and/or the RF power source 718. By varying process parameters, such as the nitrogen flow rate, the deposited TiN layer will be pTiN or mTiN. For example, if the nitrogen gas is allowed to react with the Ti target 712 (i.e., the target is poisoned), and then the TiN on the poisoned Ti target 712 is sputtered onto the substrate 722, a pTiN layer will be obtained. Alternatively, if the nitrogen gas reacts only with Ti sputtered from the Ti target 712 and deposited on the substrate 722, an mTiN layer will be obtained.

In some embodiments where the metal diffusion prevention layer includes one or more materials other than TiN, such as TaN, TiON, TaON, one or more additional process chambers as well as appropriate process recipes can be used to form such a metal diffusion prevention layer. In other embodiments where the metal diffusion prevention layer includes one or more materials other than TiN, such as TaN, TiON, TaON, one or more targets in the same process chamber for forming TiN as well as suitable process recipes can be used to form such as metal diffusion prevention layer.

Figure 8:
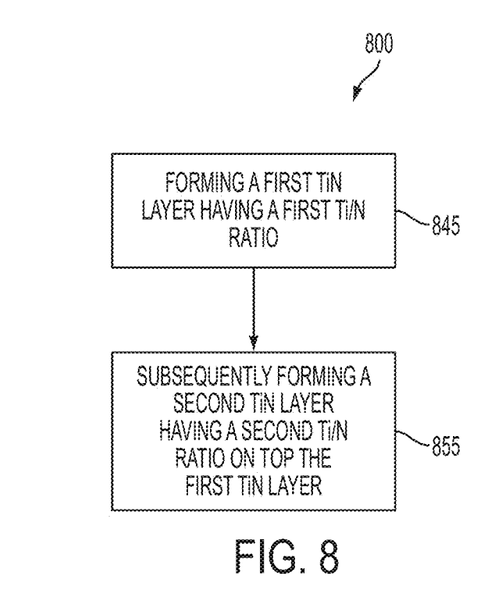
FIG. 8 is a flow chart of a method of forming a blocking structure having multiple TiN layers in accordance with one or more embodiments.

FIG. 8 is a flow chart of a method 800 of forming a blocking structure having multiple layers, such as a pTiN layer as a metal diffusion prevention layer, and an mTiN layer as an electrical performance enhancement layer, in accordance with one or more embodiments.

At step 845, a first TiN layer having a first Ti/N ratio is formed. In some embodiments, an mTiN layer is formed first to be closer to the channel region (such as the channel region 102 in FIG. 1) for obtaining greater strain effects. The Ti/N ratio of mTiN is from 1 to 1.5.

mTiN Formation

To form mTiN, a plasma 720 is generated in the chamber 700 at a flow rate of a nitrogen gas in a range from 10 sccm to 100 sccm. In some embodiments, the flow rate of the nitrogen gas is in a narrower range from 10 sccm to 70 sccm. In further embodiments, the flow rate of the nitrogen gas is in an even narrower range from 15 sccm to 60 sccm.

The plasma 720 is generated by applying an RF bias power from the RF power source 718 to the substrate 722 via the substrate support 714. At the same time a DC power is applied to the Ti target 712. The RF bias power is in a range from 100 W to 2000 W, in some embodiments. In further embodiments, the RF bias power is in a narrower range from 200 W to 1500.

In some embodiments, the DC power is in a range from 5 kW to 100 kW. In further embodiments, the DC power is in a narrower range from 10 kW to 50 kW.

In some embodiments, an inert gas (such as argon) is also introduced into the chamber 700 from the gas supply 726. The argon gas in one or more embodiments is introduced together with the nitrogen gas at a flow rate of from 0 sccm to 20 sccm. In an example, the argon gas flow rate is about 8 sccm at the nitrogen gas flow rate at 60 sccm.

In some embodiments, the substrate is heated at a temperature in a range from 0° C. to 300° C. In further embodiment, the substrate is heated at a temperature in a narrower range from 20° C. to 250° C.

In some embodiments, the mTiN layer is deposited to a thickness in a range from 5 Å to 50 Å.

At step 855, a second TiN layer having a second Ti/N ratio is formed on the first TiN layer. In some embodiments, a pTiN layer is formed next to be closer to the metal cap layer (such as the cap layer 118 in FIG. 1) for obtaining greater metal diffusion prevention effects. The Ti/N ratio of pTiN is from 0.7 to 1.

pTiN Formation

To form pTiN, a plasma 720 is generated in the chamber 700 at a flow rate of a nitrogen gas in a range from 10 sccm to 200 sccm. In some embodiments, the flow rate of the nitrogen gas is in a narrower range from 30 sccm to 180 sccm. In further embodiments, the flow rate of the nitrogen gas is in an even narrower range from 40 sccm to 150 sccm.

The plasma 720 is generated by applying a DC power to the Ti target 712. An RF bias power from the RF power source 718 is, in one or more embodiments, discontinued during the formation of pTiN.

In some embodiments, the DC power is in a range from 5 kW to 100 kW. In further embodiments, the DC power is in a narrower range from 10 kW to 50 kW.

In some embodiments, an inert gas (such as argon) is also introduced into the chamber 700 from the gas supply 726. The argon gas in one or more embodiments is introduced together with the nitrogen gas at a flow rate of from 0 sccm to 20 sccm. In an example, the argon gas flow rate is about 4 sccm at the nitrogen gas flow rate at 100 sccm.

In some embodiments, the substrate is heated at a temperature in a range from 0° C. to 300° C. In further embodiment, the substrate is heated at a temperature in a narrower range from 20° C. to 250° C.

In some embodiments, the pTiN layer is deposited to a thickness in a range from 5 Å to 50 Å.

The above description of the steps of the method 800 can be reversed in one or more embodiments, i.e., a pTiN is formed first (to be adjacent the work function layer 112), followed by an mTiN layer formed on the pTiN layer (to be adjacent the cap layer 118).

One or more of steps 845, 855 can be repeated in accordance with one or more embodiments to form a blocking structure with three or more alternating electrical performance enhancement (mTiN) and metal diffusion prevention (pTiN) layers. The total thickness of the blocking structure should be, however, observed to ensure adequate conductivity from the cap metal layer (e.g., cap layer 118 in FIG. 1) to the metal gate electrode (e.g., the work function layer 112 in FIG. 1). In some embodiments, the total thickness of the blocking structure is in a range from 10 Å to 100 Å.

In some embodiments, at least a pTiN layer and an mTiN layer are conveniently formed in the same process chamber, such as the chamber 700. Only adjustment and/or turning on/off of the DC and/or RF power and/or gas supplies are needed to switch the deposition from one type of TiN to another.

In further embodiments, pTiN and mTiN layers are formed in different process chambers. A reason is that once a Ti target has been poisoned for forming a pTiN layer, it might no longer be suitable for forming mTiN. Therefore, it is desirable in one or more embodiments to have a process chamber only for forming mTiN and another process chamber only for forming pTiN.

Although PVD has been described at the primary method of forming pTiN and mTiN, other methods that can deposit such types of TiN are not excluded, and are within the scope of this disclosure. Likewise, other suitable materials, such as TaN, TiON, TaON, are formed, in accordance with further embodiments, in appropriate process chambers using appropriate process recipes to form a metal diffusion prevention layer instead of, or in addition to, the pTiN layer disclosed herein.

Figure 9:
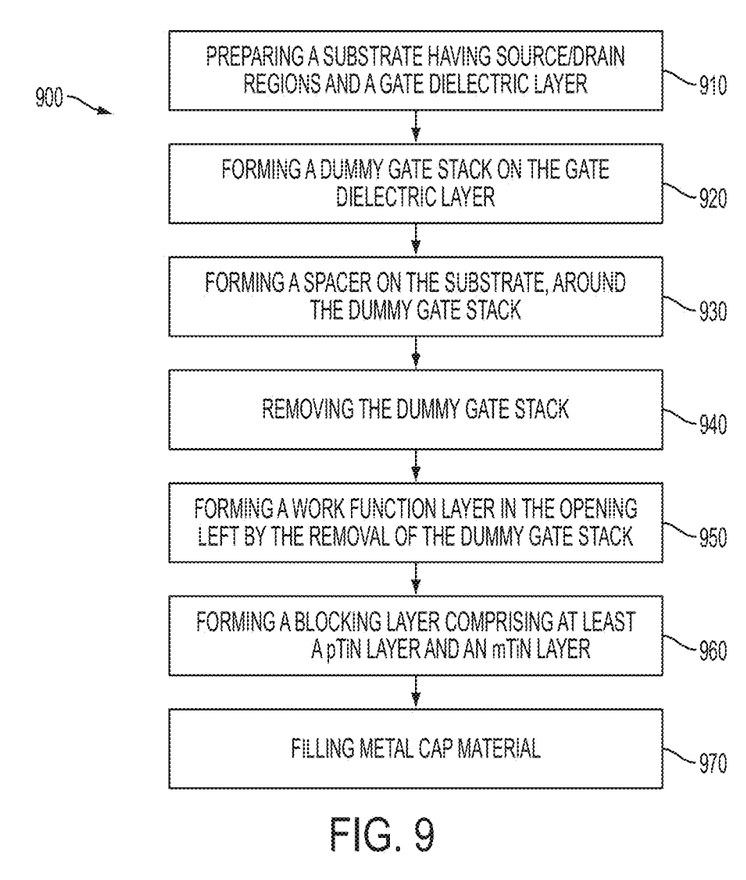
FIG. 9 is a flow chart of a method of forming a semiconductor device which includes a blocking structure having multiple TiN layers in accordance with one or more embodiments.
Figure 10A:
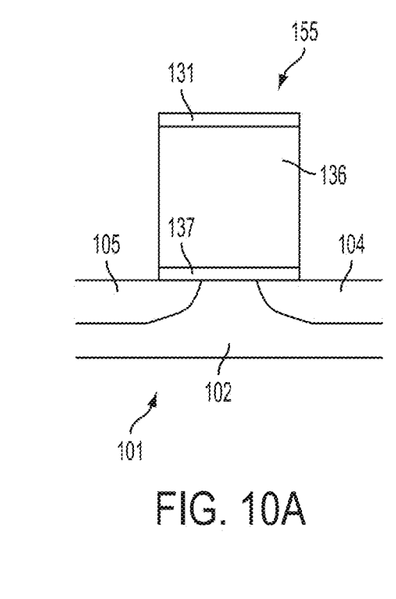
FIGS. 10A-10C are schematic cross-sectional view of the semiconductor device during the manufacturing process of the method of FIG. 9.
Figure 10B:
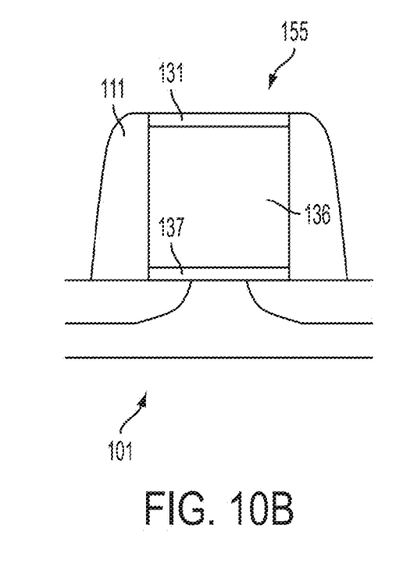
Figure 10C:
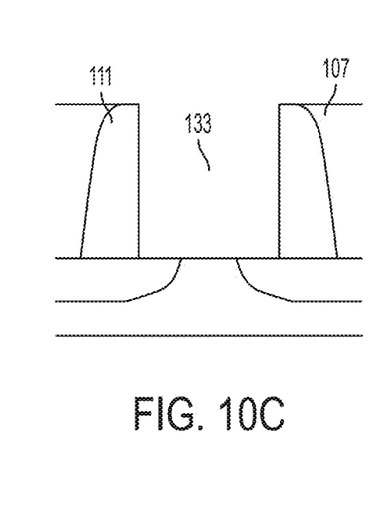

FIG. 9 is a flow chart of a method 900 of forming a semiconductor device, such as the semiconductor device 100 of FIG. 1, which includes a blocking structure having multiple layers in accordance with one or more embodiments. FIGS. 10A-10C are schematic cross-sectional views of the semiconductor device during the manufacturing process of the method 900.

At step 910 and as shown in FIG. 10A, a substrate 101 having source/drain regions 104, 105 and a channel region 102 as disclosed with respect to FIG. 1 is prepared. A gate dielectric layer 137 is formed over at least the channel region 102. The gate dielectric layer 137 in one or more embodiments includes the same material and is formed in the same way as the gate dielectric 108 disclosed with respect to FIG. 1. The gate dielectric layer 137 will later become or be replaced with the gate dielectric 108.

At step 920 and as shown in FIG. 10A, a dummy gate stack 155 is formed on the gate dielectric layer 137. The dummy gate stack 155 includes a sacrificial layer 136 on the gate dielectric layer 137, and a hard mask layer 131 on the sacrificial layer 136.

In some embodiments, the sacrificial layer 136 comprise poly-silicon and is deposited over the substrate 101 to a thickness of about 1000 Å, for example. The hard mask layer 131 in one or more embodiments comprises silicon nitride and is deposited over the sacrificial layer 136 to a thickness of about 200 Å, for example. The deposited sacrificial layer 136 and hard mask layer 131 are then patterned, e.g., by etching, to form the dummy gate stack 155.

At step 930 and as shown in FIG. 10B, spacers 111 as disclosed with respect to FIG. 1 are formed on opposite sides of the dummy gate stack 155. First, a silicon nitride layer is formed over the structure shown in FIG. 10A, to a sufficient thickness, e.g., 1000 Å. The silicon nitride layer is subsequently etched, e.g., by an anisotropic etching process to obtain the structure shown in FIG. 10B. The hard mask layer 131 maintains the sacrificial layer 136 substantially intact during the etching process.

At step 940 and as shown in FIG. 10C, a dielectric layer 107 as disclosed with respect to FIG. 1 is deposited over the structure shown in FIG. 10B. The dielectric layer 107 is then removed, followed by a removal of the hard mask layer 131, by, e.g., a CMP process. The exposed sacrificial layer 136 is removed next to form an opening or trench 133, by e.g., wet etching.

As shown in FIG. 10C, the gate dielectric layer 137 is removed to be replaced by a subsequently deposited gate dielectric 108. in other embodiments, the gate dielectric layer 137 remains at the bottom of the opening 133 and functions as the gate dielectric 108.

At step 950 and as shown in FIG. 1, after the removal of the dummy gate stack 155 and the gate dielectric layer 137, an optional interfacial layer 106, a high-k gate dielectric 108, a barrier layer 110, and a work function layer 112 are sequentially deposited in the opening 133.

At step 960 and as shown in FIG. 1, a blocking structure 114 is formed next over the work function layer 112. The method and equipment disclosed herein above are used to form the blocking structure 114 from at least a electrical performance enhancement layer, e.g., an mTiN layer, and a metal diffusion prevention layer, e.g., one or more of a pTiN layer, a TaN layer, a TiON layer or a TaON layer.

At step 970 and as shown in FIG. 1, an optional wetting layer 116 is formed over the blocking structure 114, followed by the filling of metal in the opening 133, thereby obtaining a cap layer 118. Finish steps (not shown), such as CMP, are then performed to obtain the semiconductor device 100.

The above-described process is a gate replacement process (or a gate-last approach). Other arrangements, e.g., a gate-first approach, are not excluded.

In accordance with one embodiment, a method of manufacturing a semiconductor device, and the method includes forming a stack of a work function layer, a blocking structure, and a metal cap layer sequentially on a substrate. The forming of the blocking structure includes sequentially depositing at least a metal diffusion prevention layer over the work function layer and an electrical performance enhancement layer over the metal diffusion prevention layer before forming the metal cap layer. The electrical performance enhancement layer includes a TiN layer having a Ti/N ratio greater than 1.

In accordance with another embodiment, a method includes forming a blocking structure in an opening, and the opening is defined over a channel region in a substrate. A metal layer is formed over the blocking structure, and the metal layer comprising a metallic material. The forming the blocking structure includes forming a first layer over the channel region, and the first layer comprises a TiN layer has a Ti/N ratio greater than 1. The forming the blocking structure also includes forming a second layer over the first layer, and the second layer is configured as a diffusion barrier to the metallic material.

In accordance with another embodiment, a method includes forming a dummy gate stack over a substrate; forming a layer of dielectric material surrounding the dummy gate stack; removing the dummy gate stack to define an opening; forming a blocking structure in the opening; and forming a metal layer in the opening. The metal layer includes a metallic material, and the blocking structure is between the metal layer and a bottom surface and a sidewall of the opening. The forming the blocking structure includes forming a first layer in the opening extending along the bottom surface and the sidewall of the opening, and the first layer is configured to provide a stress to a channel region under the first layer. The forming the blocking structure also includes forming a second layer in the opening extending along the bottom surface and the sidewall of the opening, the first layer is between the second layer and the bottom surface and the sidewall of the opening, and the second layer is configured as a diffusion barrier to a metallic material.

The foregoing has outlined features of several embodiments so that those skilled in the art may better understand the detailed description that follows. Those skilled in the art should appreciate that they may readily use the present disclosure as a basis for modifying other processes and structures for carrying out one or more of the same or similar purposes and/or achieving one or more of the same or similar advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, said method comprising:
   forming a stack of a work function layer, a blocking structure, and a metal cap layer sequentially on a substrate;
   wherein the forming of the blocking structure comprises sequentially depositing at least a metal diffusion prevention layer over the work function layer and an electrical performance enhancement layer over the metal diffusion prevention layer before forming the metal cap layer, and the electrical performance enhancement layer comprises a TiN layer having a Ti/N ratio greater than 1.

2. The method according to claim 1, wherein the metal diffusion prevention layer comprises a material including poisoned TiN, TaN, TiON, or TaON.

3. The method according to claim 1, wherein
   a poisoned TiN layer is formed as the metal diffusion prevention layer;
   a metallic TiN layer is formed as the electrical performance enhancement layer; and
   the TiN layers are deposited in a single PVD (physical vapor deposition) chamber.

4. The method according to claim 1, wherein
   a poisoned TiN layer is formed as the metal diffusion prevention layer;
   a metallic TiN layer is formed as the electrical performance enhancement layer;
   the TiN layers are deposited by a PVD (physical vapor deposition) process comprising generating a plasma in a PVD chamber while flowing a nitrogen gas through the PVD chamber;
   a flow rate of the nitrogen gas for forming the metallic TiN layer is in a range from 10 sccm to 100 sccm; and
   a flow rate of the nitrogen gas for forming the poisoned TiN layer is in a range from 10 sccm to 200 sccm.

5. The method according to claim 4, wherein
   the depositing of the TiN layers further comprises flowing an inert gas through the PVD chamber;
   a flow rate of the inert gas for forming the metallic TiN layer is in a range from 0 sccm to 20 sccm; and
   a flow rate of the inert gas for forming the poisoned TiN layer is in a range from 0 sccm to 20 sccm.

6. The method according to claim 4, wherein
   the metallic TiN layer is deposited to a thickness ranging from 5 Å to 50 Å; and
   the poisoned TiN layer is deposited to a thickness ranging from 5 Å to 50 Å.

7. The method according to claim 1, further comprising:
   performing a gate replacement process to define an opening in a dielectric layer on the substrate,
   wherein the stack is subsequently formed in said opening.

8. The method according to claim 1, wherein
   the work function layer is formed of at least a metal having a work function suitable for a PMOS or an NMOS;
   the metal cap layer is formed of Al;
   a metallic TiN layer is formed as the electrical performance enhancement layer over the work function layer; and
   a poisoned TiN layer is formed as the metal diffusion prevention layer over the metallic TiN layer and under the metal cap layer.

9. The method according to claim 1, further comprising depositing at least another electrical performance enhancement or metal diffusion prevention layer to form the blocking structure as a multilayer structure of alternating electrical performance enhancement or metal diffusion prevention layers.

10. A method comprising:
    forming a blocking structure in an opening, the opening being defined over a channel region in a substrate, the forming the blocking structure comprising:
       forming a first layer over the channel region, the first layer comprises a TiN layer having a Ti/N ratio greater than 1; and
       forming a second layer over the first layer, the second layer being configured as a diffusion barrier to a metallic material; and
    forming a metal layer over the blocking structure, the metal layer comprising the metallic material.

11. The method of claim 10, wherein the forming the first layer comprises performing a PVD (physical vapor deposition) process, the PVD process comprises generating a plasma in a PVD chamber while flowing a nitrogen gas through the PVD chamber, and a flow rate of the nitrogen gas ranges from 10 sccm to 100 sccm.

12. The method of claim 11, wherein the generating the plasma comprises using an RF bias power ranging from 100 W to 2000 W.

13. The method of claim 11, wherein the generating the plasma comprises using a DC power ranging from 5 kW to 100 kW.

14. The method of claim 10, wherein the second layer comprises a material including TiN, TaN, TiON, or TaON.

15. The method of claim 10, wherein the second layer comprises a TiN layer having a Ti/N ratio less than 1.

16. The method of claim 15, wherein the forming the second layer comprises performing a PVD (physical vapor deposition) process, the PVD process comprises generating a plasma in a PVD chamber while flowing a nitrogen gas through the PVD chamber, and a flow rate of the nitrogen gas ranges from 10 sccm to 200 sccm.

17. The method of claim 16, wherein the generating the plasma comprises using a DC power ranging from 5 kW to 100 kW.

18. A method comprising:
    forming a dummy gate stack over a substrate;
    forming a layer of dielectric material surrounding the dummy gate stack;
    removing the dummy gate stack to define an opening;
    forming a blocking structure in the opening, the forming the blocking structure comprising:
       forming a first layer in the opening extending along a bottom surface and a sidewall of the opening, the first layer being configured to provide a stress to a channel region under the first layer, and the first layer comprising a TiN layer having a Ti/N ratio greater than 1; and
       forming a second layer in the opening extending along the bottom surface and the sidewall of the opening, the first layer being between the second layer and the bottom surface and the sidewall of the opening, and the second layer being configured as a diffusion barrier to a metallic material; and
    forming a metal layer in the opening, the metal layer comprising the metallic material, and the blocking structure being between the metal layer and the bottom surface and the sidewall of the opening.

19. The method of claim 18, wherein the second layer comprises a material including TiN, TaN, TiON, or TaON.

* * * * *